United States Patent [19]

Yefsky

[11] 4,302,714

[45] Nov. 24, 1981

[54] RECHARGEABLE BATTERY CHARGER SYSTEM FOR CHARGING TESTING, REJUVENATION AND PREVENTATIVE MAINTENANCE

[76] Inventor: Sheldon A. Yefsky, 5033 W. Morse, Skokie, Ill. 60077

[21] Appl. No.: 33,818

[22] Filed: Apr. 27, 1979

[51] Int. Cl.³ .................. H02J 7/00; G08B 21/00
[52] U.S. Cl. .................................. 320/5; 320/14; 320/39; 320/48; 340/636
[58] Field of Search ............ 320/5, 14, 22, 13, 39, 320/40, 37, 38, 48; 340/636

[56] References Cited

U.S. PATENT DOCUMENTS

| | | |
|---|---|---|
| 3,041,522 | 6/1962 | Beck et al. . |
| 3,413,536 | 11/1968 | Webb . |
| 3,454,859 | 7/1969 | Ford et al. . |
| 3,500,167 | 3/1970 | Applegate et al. . |
| 3,781,657 | 12/1973 | Dennstedt . |
| 3,796,940 | 3/1974 | Mauch et al. . |
| 3,940,679 | 2/1976 | Brandwein et al. . |
| 3,950,689 | 4/1976 | Jamison . |
| 3,997,830 | 12/1976 | Newell et al. . |
| 4,016,473 | 4/1977 | Newman . |
| 4,025,916 | 5/1977 | Arnold et al. . |
| 4,041,369 | 8/1977 | King et al. . |
| 4,052,717 | 10/1977 | Arnold et al. . |
| 4,080,560 | 3/1978 | Abert . |
| 4,081,743 | 3/1978 | Madden . |

Primary Examiner—Robert J. Hickey
Attorney, Agent, or Firm—Robert M. Ward

[57] ABSTRACT

The present invention is directed to a method for automatically maintaining rechargeable batteries at maximum capacity and includes the steps of detecting the presence of a battery, deep discharging the battery to a predetermined level above cell reversal, recharging the battery to its rated capacity, discharging the battery at a controlled rate while measuring battery output voltage and determining whether its capacity is above or below a selected minimum, deep discharging and recharging if the battery is below the selected minimum until reversible memory effects are removed, providing a positive indication of battery failure, maintaining the full battery capacity by trickle charging, and periodically repeating the above steps to avoid onset of battery memory.

5 Claims, 7 Drawing Figures

RECHARGEABLE BATTERY CHARGER SYSTEM FOR CHARGING TESTING, REJUVENATION AND PREVENTATIVE MAINTENANCE

BACKGROUND OF THE INVENTION

The present invention relates to methods of charging batteries and more particularly to a method for automatically maintaining rechargeable batteries at maximum capacity and to erase and prevent the memory effect.

The prior art has recognized the problem of battery memory and its resultant lowering of cell capacity caused by repetitive charge-discharge cycles which fail to extract full rated capacity and from continuous trickle charging for long periods of time and from operations at elevated temperatures. A battery that has developed the memory effect is unable to deliver its full rated capacity. That defect may be disabling to the equipment powered by a battery having the memory effect and may result in a potentially dangerous situation to the user of the equipment.

The prior art has also recognized the desirability of providing apparatus for rejuvenating a deplected battery to its full capacity. Such systems have not however disclosed or suggested the sequenced method of the present invention of automatic deep discharge, recharge, capacity test, charge holding, and recycle which are each necessary for a fully functional system.

BRIEF SUMMARY OF THE INVENTION

The present invention relates to a system providing an automatic method for charging, conditioning and testing rechargeable batteries. The system functions to provide a solution to the memory effect problem in rechargeable batteries, by both preventing the memory effect in cells and rejuvenating cells which had been exposed to the memory effect and in which the memory effect is still reversible.

The method of the present invention utilizes electronic and/or electro-mechanical devices which sequence a battery through a series of steps which provide the necessary functions. The sequence of steps includes a means for automatically discharging the cell to a point at which all but a minute fraction of the stored energy in the cell is removed. This step prevents the accumulation of memory effect due to extracting small and incomplete withdrawals of energy from the battery. This step provides for a uniform degree of discharge of all cells independent of the degree to which the battery is discharged in actual service and within the actual limits of the cell capacity. Each battery is then charged and subjected to a capacity test. The capacity test reveals whether or not the cell, when fully charged, has the capacity rated by the manufacturer.

Next, rejuvenation means are utilized. Therein, batteries which fail to pass the capacity test are cycled through one or more discharge-charge steps which will reverse the effects of memory that are still reversible. In this fashion, batteries are rejuvenated which would otherwise proceed to accumulate memory effect and ultimately induce total failure of the battery.

Batteries which pass the capacity test and rejuvenated batteries are recharged and held for a period of time under trickle charge conditions. After a predetermined interval, batteries which have not been removed for field use are recycled through the system. Thus, the accumulation of memory effect which prolonged charging induces in batteries is prevented. This recycling step also prevents memory effect induced by non-use of cells, whether or not the batteries are charged under prolonged charged conditions.

The automatic recharging method of the present invention is important economically to users of batteries because it enables batteries to deliver their rated number of cycles and to deliver the full rated energy output for the rated number of cycles. This advantage can be especially important for users of rechargeable cells in remote locations where such batteries cannot easily be tested or serviced, such as in spacecraft, mountains, and in solar energy applications. The method of the present invention is also important to fire, police and other public safety applications where life and property are at stake, and the public safety communication systems which depend on battery power and must function at full design capacities.

In summary, the present invention may be utilized, inter alia, to: test the capacity of a battery; rejuvenate a battery by reversing the reversible portion of the memory effect (or any other process which will affect battery performance and which is due to lack of periodic energy withdrawal and/or prolonged periods of overcharging); and charge and maintain a battery at full capacity while preventing the memory effect (or any other process which will affect battery performance and which is due to lack of periodic energy withdrawal and prolonged periods of overcharging).

BRIEF DESCRIPTION OF THE DRAWING

The method of the present invention for automatically maintaining rechargeable batteries may be better understood by reference to the following drawing, wherein.

DETAILED DESCRIPTION OF PREFERRED EMBODIMENTS

The present invention concerns methods for automatically maintaining rechargeable batteries at maximum capacity. In a preferred embodiment the method of the present invention includes the steps of detecting presence of the battery, and initially discharging the battery to a selected value of deep discharge. The selected value of deep discharge is above the level of cell reversal. Next, the battery is initially recharged to its rated capacity, after which it is subsequently discharged at a controlled rate. During discharge the battery output voltage is measured and a determination is made as to whether the output voltage is above or below a selected minimum voltage for a selected period of time.

If the output voltage is above a selected minimum voltage for a selected time period, the battery is recharged to its full capacity and maintained at the full capacity by trickle charging. Periodically, the above steps are repeated to prevent onset of battery memory caused by prolonged charging.

If the level of the output voltage falls below the selected minimum prior to the end of the selected time period, the battery is recharged to its full rated capacity, and the above steps of discharging and recharging are repeated until reversible memory effects are removed. Thereafter, the battery is maintained at its full capacity by trickle charging, and the above steps are periodically repeated to avoid onset of battery memory caused by prolonged continuous charging.

The initial discharging removes all but a minute fraction of the stored energy of the rechargeable battery. This initial discharging also prevents the accumulation of memory effect which is caused by extracting small and incomplete withdrawals of energy from the rechargeable battery. Further, the initial discharging provides for a uniform degree of discharge of the rechargeable battery independent of the degree to which the battery is discharged in actual use. Said discharge is within the actual limits of the cell capacity. Additionally, the above selected minimum voltage may preferably be the rated capacity of the rechargeable battery.

Figure 1:
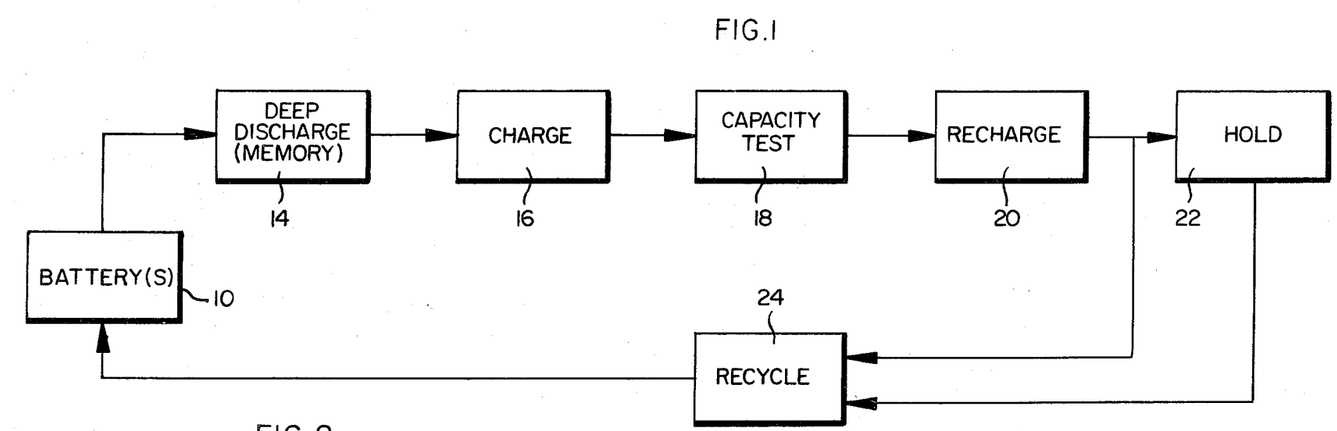
FIG. 1 is a flow chart diagram showing the steps of the method of the present invention.
Figure 2:
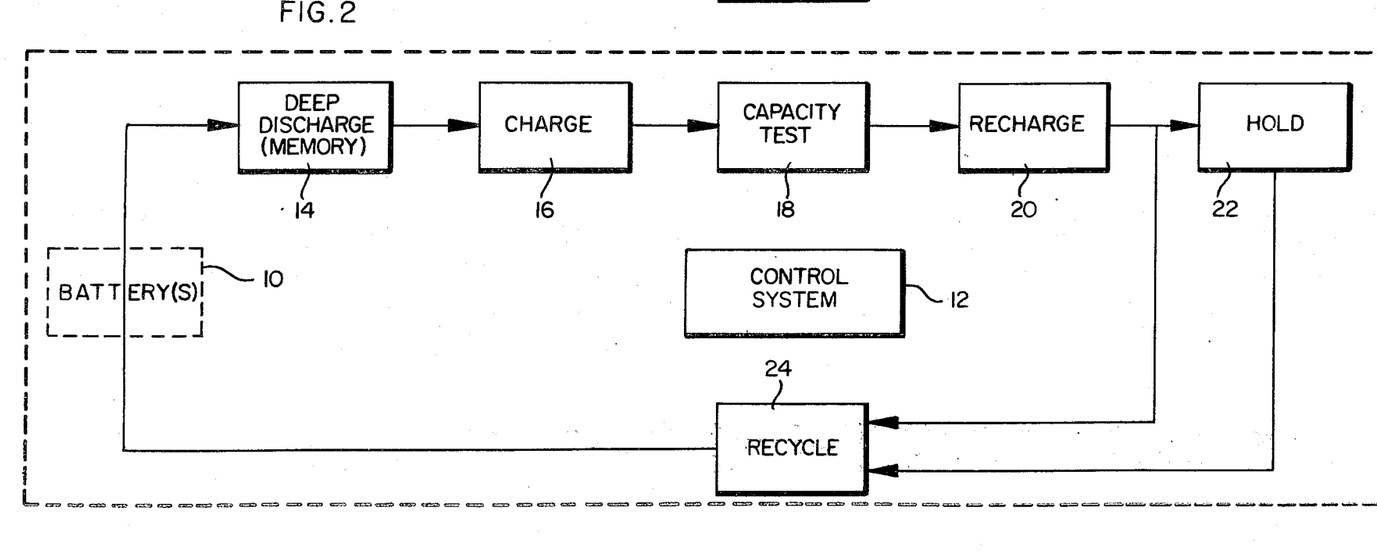
FIG. 2 is another flow chart diagram illustrating schematically the circuitry for carrying out the automated steps of the method of the present invention.

Referring now to the drawings and to FIGS. 1 and 2 in particular, a battery 10 is connected into the circuits shown in FIGS. 1 and 2. After its presence is sensed by the control system 12, the battery is subjected to deep discharge 14 to erase memory effects. Next, the battery is charged as shown at step 16. Thereafter, a capacity test 18 is applied to the battery 10 to determine whether the output voltage is above or below a selected minimum voltage during a preselected period of discharge at a selected discharge rate. Thereafter, if battery 10 is above a selected minimum voltage, it is recharged 20 and may either be held 22 or recycled 24.

Figures 3, 4:
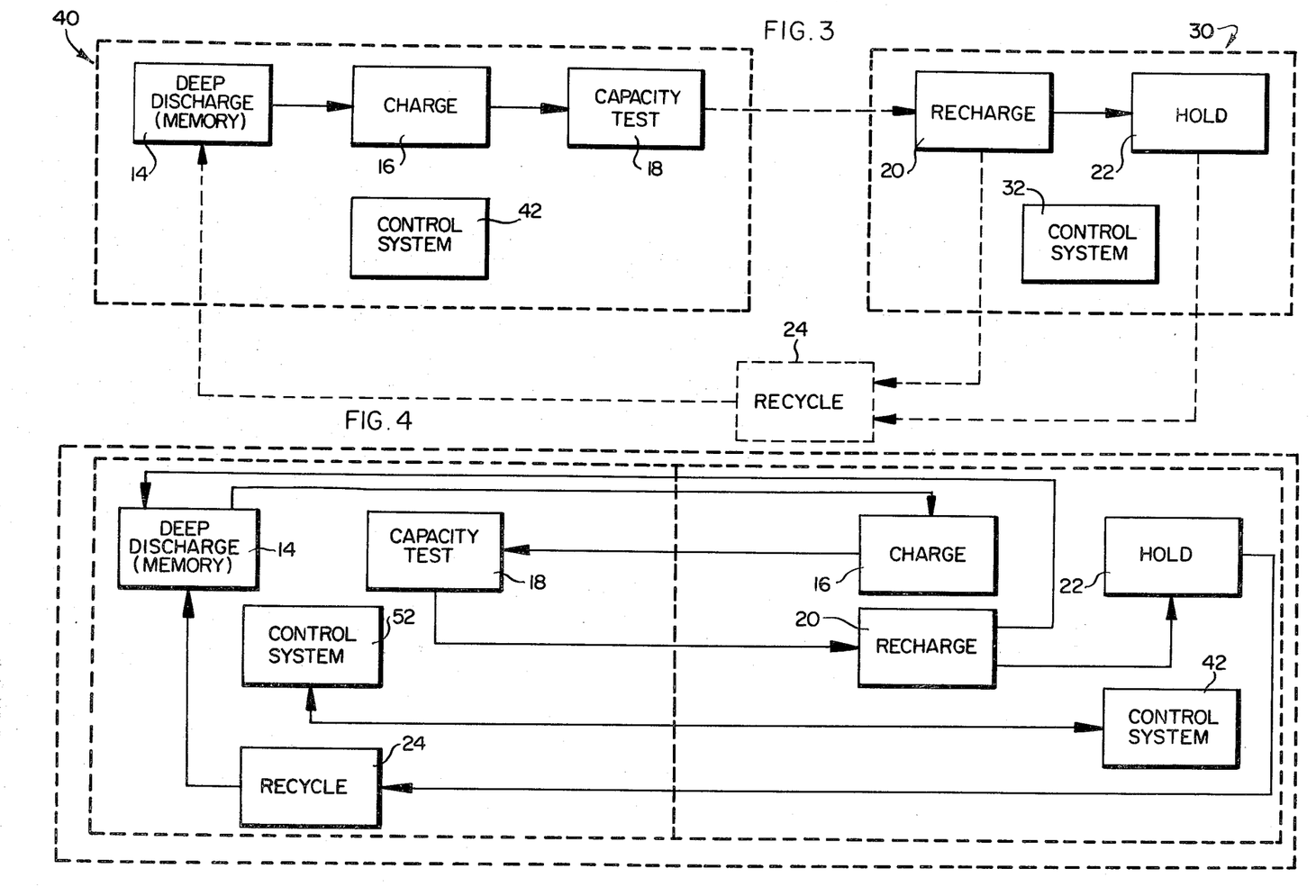
FIG. 3 is a flow chart diagram schematically illustrating a manual system consisting of an existing charger system and a new charger subsystem wherein the new charger subsystem is used to deep discharge the battery and to capacity test the battery, and wherein the existing charger system is used to charge the battery; after the capacity test, the battery is removed from the system and inserted for recharge in the existing battery charger system; and for recycle, the battery must be removed from the existing charger system and the process initiated on a manual basis.
FIG. 4 is a flow chart diagram schematically illustrating new subsystems integrated into an existing battery charger subsystem and wherein the new elements comprise interconnected and cooperating circuitry for deep discharge, capacity test, and recycle.

With respect to FIG. 3, an existing charging system generally 30 is utilized in conjunction with a new charge subsystem generally 40. The battery is first subjected to a deep discharge step 14 to remove any memory, after which it is charged 16 and capacity tested 18. Each of these charge 16 and capacity tested 18. Each of these functions is controlled by a subsystem control 42. Thereafter, the battery is manually removed and recharged by means of subsystem 30 at recharge step 20 and is held at step 22. Each of these functions is controlled by a separate subsystem control mechanism 32. For the recycling step 24, the above steps are repeated beginning with another deep discharge cycle 14 to prevent the onset of any memory.

With respect to FIG. 4, subsystems containing elements for deep discharge, testing and recycling are cooperatively integrated into an existing battery charger. Therein, provision is made for repeated deep discharge and recharge to remove any memory effect present in a capacity tested battery which does not have an output voltage above a selected minimum voltage during the discharge period. In the symbolic circuitry of FIG. 4, the battery is subjected to a deep discharge step 14 to remove any memory effect, after which it is charged at step 16. A capacity step 18 follows, after which the battery is recharged 20 and either held 22, if its output voltage is above a selected minimum, or is again deep discharged 14, if its output voltage is below a selected minimum. After the step of deep discharge 14, the charge step 16 and capacity test step 18 are also repeated. If the output voltage of the battery is now above a selected minimum, it is held 22, and thereafter recycled 24, where the trickle charging of the hold step 22 is for an extended period of time. Control systems 42 and 52 are utilized to monitor and effectuate the above steps.

Figure 5:
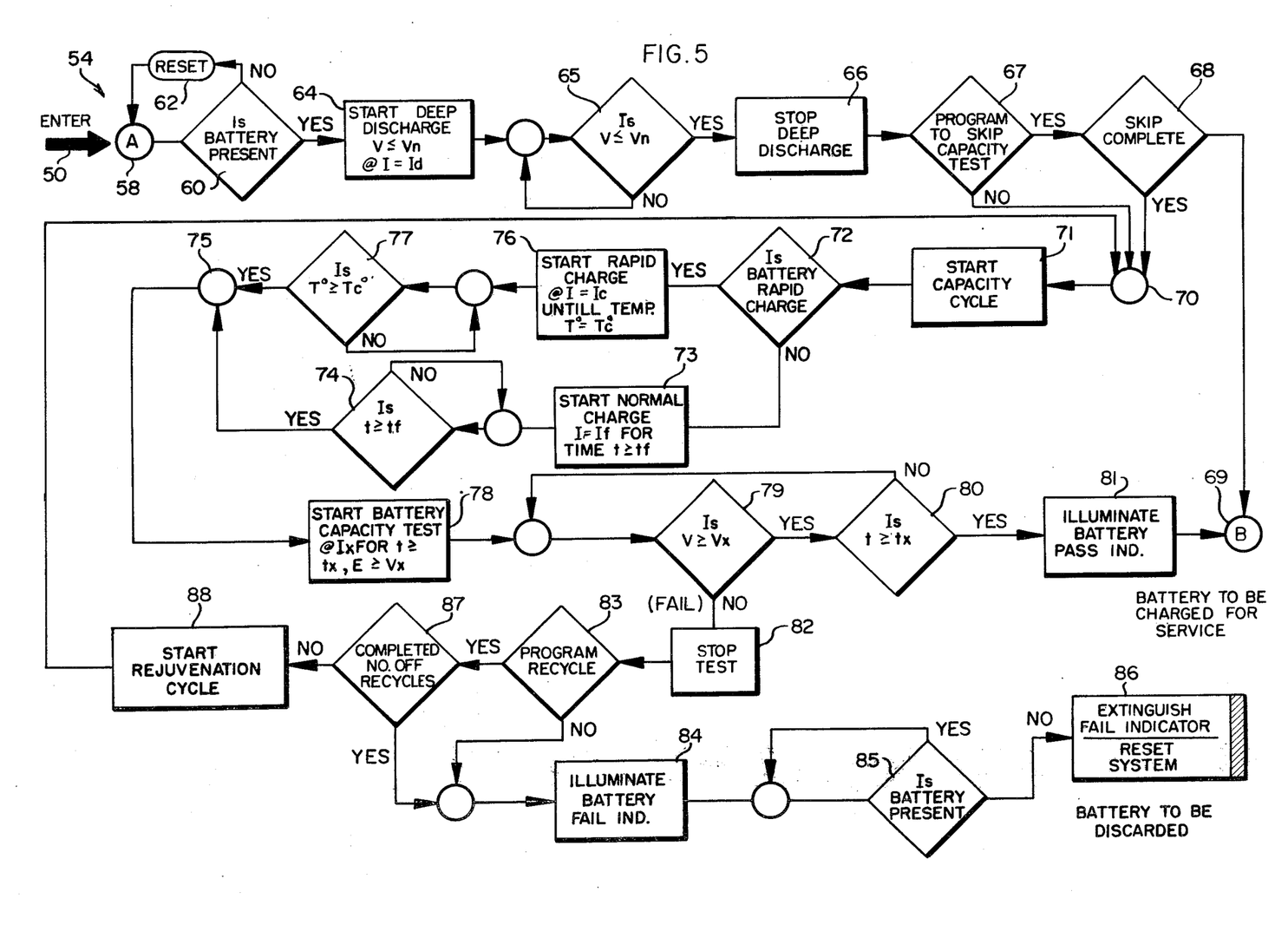
FIG. 5 is a symbolic block circuit diagram illustrating a battery charger for carrying out the testing, rejuvenating and rejecting steps of a preferred embodiment of the method of the present invention.
Figure 6:
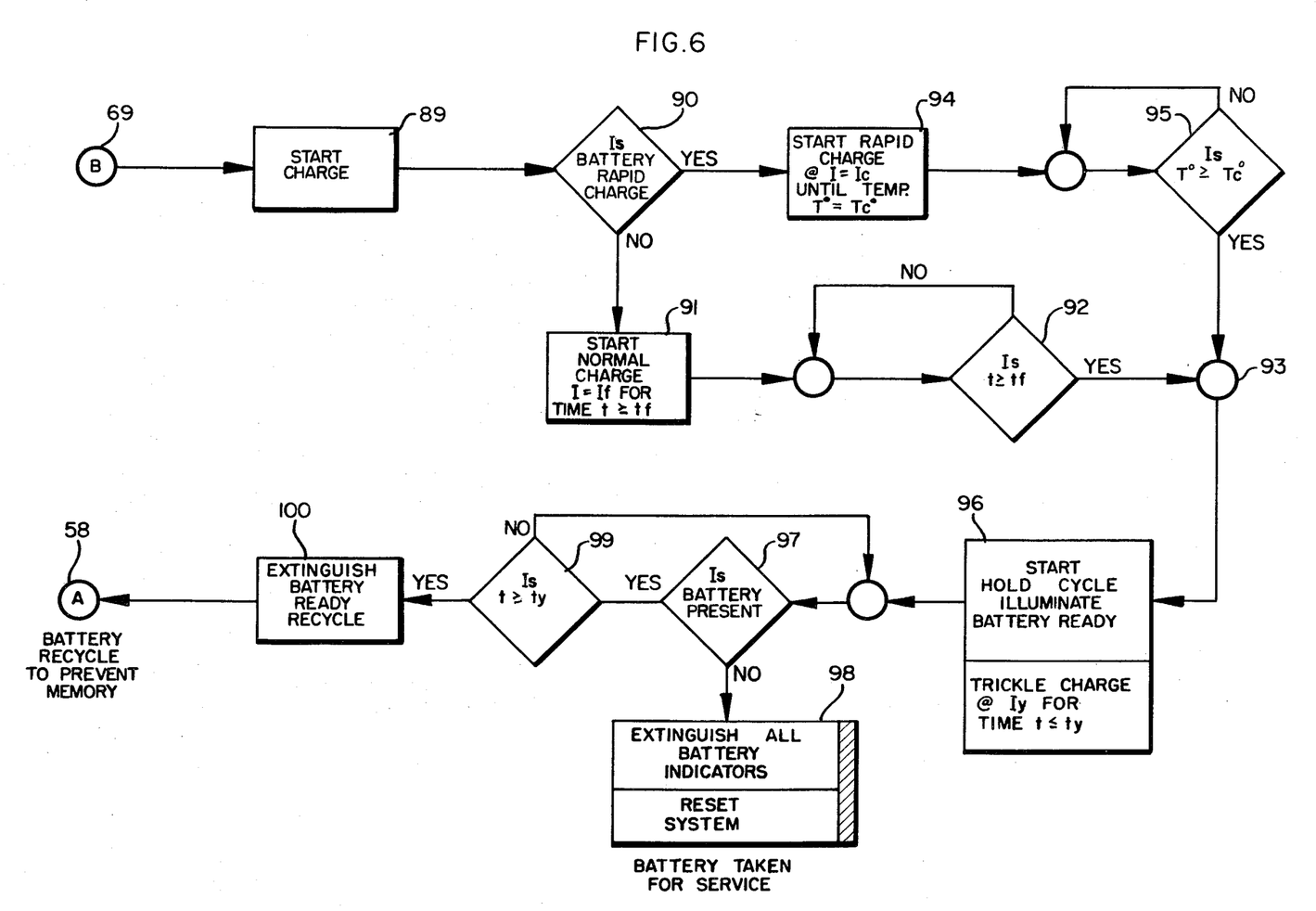
FIG. 6 is a continuation of the symbolic block diagram of FIG. 5 for the steps of charging the battery for service use.

FIGS. 5 and 6 show the basic control system and flow chart in block diagram form of a preferred automatic battery charger embodying the method of invention.

The battery charger generally 54 has a suitable battery receiver 56. The receiver 56 has electrical connections that are specific to the battery type for which a charger has been manufactured.

Figure 7:
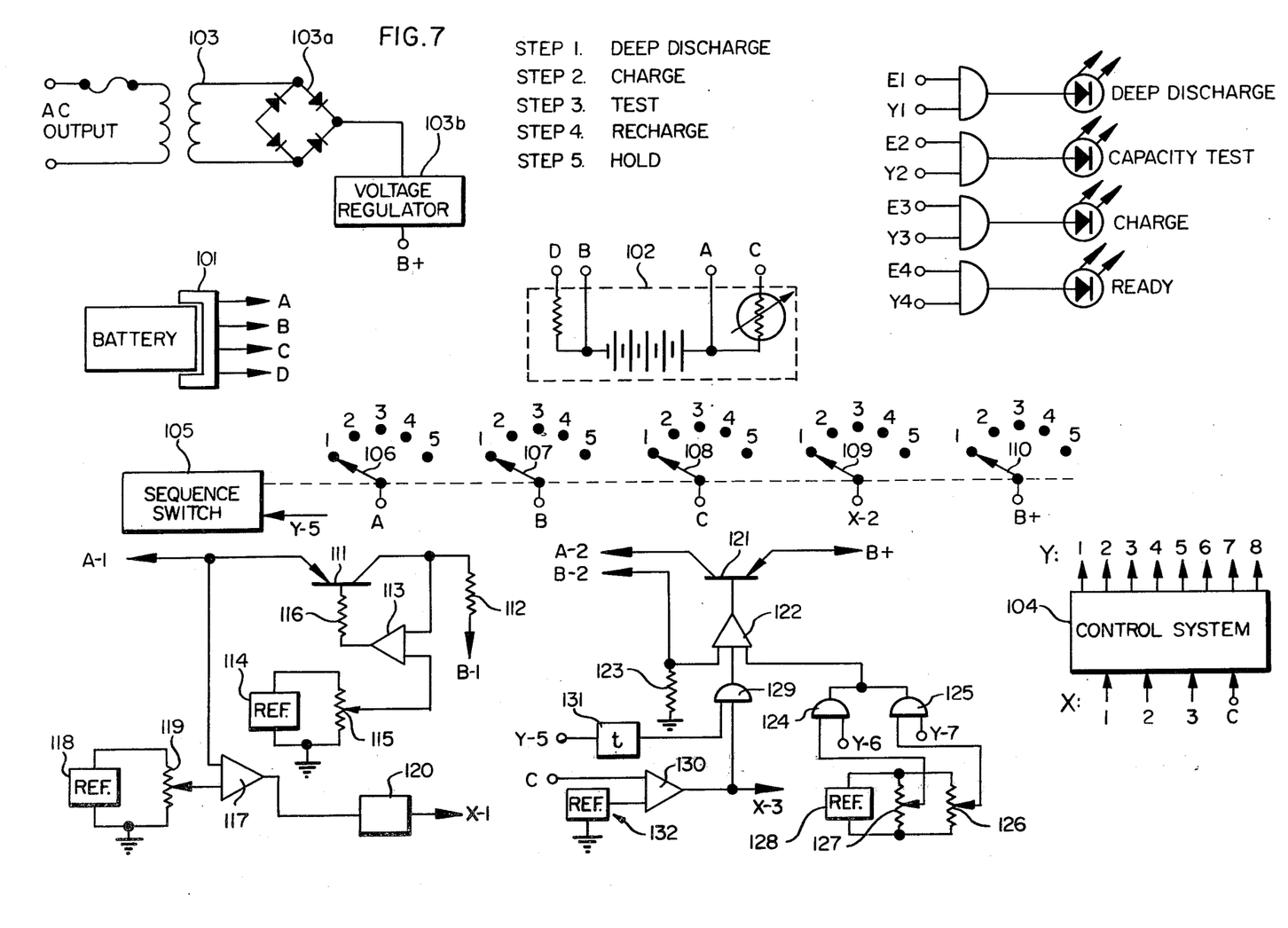
FIG. 7 is a group of several symbolic diagrams of typical circuits for accomplishing the sequencing, charging and discharging steps of the method of the present invention.

The receiving connector 56 has a detector terminal 58 and generally A in FIGS. 5–7, which determines if a battery is present or not. The detector 58 is connected to logic stage 60. If the battery is not present, reset stage 62 is activated by logic stage 60 and resets all circuits in battery charger 54. If the battery 10 is present, logic stage 60 activates the deep discharge stage 64 and the deep discharge cycle commences.

The deep discharge cycle is performed at a fixed current for a period of time until the terminal voltage of the battery reaches a fixed voltage, both of which are specific for a given type of battery and in accordance with the manufacturer's specifications. The current selected, Id, normally corresponds to the 1C discharge ratio. That is the rate at which the full rated energy capacity of the battery would be discharged in 1 hour. Each type of battery manufactured has a specific terminal voltage Vn at deep discharge. For NiCd, that voltage, Vn, is normally 1.0 volt times the number of actual cells (n) serially connected in the battery pack. The discharge takes place at a current Id. The discharge indicator is illuminated by the deep discharge stage 64.

Detector 65 constantly monitors the terminal voltage V of the cell and as long as V is greater than Vn, the deep discharge cycle continues. Normally, this cycle will be completed in 1 hour or less if the discharge rate Id is set at 1C. If the battery had been heavily utilized prior to insertion in the charger 54 so that most of its stored energy gas been drained, then the time spent in the deep discharge circuit would be minimal. If the battery had been lightly drained, then the discharge time would approach 1C. If the manufacturer permits discharge rates for the battery in excess of the standard IC rate, the total time of deep discharge is reduced. it is the performance of this deep discharge stage 64 which provides preventive maintenance for batteries. Deep discharge stage 64 prevents the accumulation of memory effect which is due to crystal growth or any of the other factors reported in the literature.

When detector stage 65 determines that V is less than or equal to the specific Vn, logic stage 66 stops the deep discharge and extinguishes the discharge cycle indicator. The steps of deep discharge 64 through deep discharge stop 66 prevent memory effect and accumulation. Upon completion of the deep discharge stage 64, the logic circuit 67 for skipping the capacity test functions to determine whether the battery is to be subjected to the capacity test cycle or whether it is to be charged for service. Such a logic circuit stage 67 is important under several circumstances. For example, if the batteries are of the normal type requiring 7 to 14 hours of charge, there may not be sufficient time and/or supply of batteries and chargers to take a battery out of service for a period equal to approximately 2 full charge-discharge cycles.

With logic circuit stage 67, the user may determine if the frequency of capacity test is to be reduced to either a multiple of the actual use cycles or is to be reduced to a periodic check. Another circumstance where the frequency of capacity tests would be reduced is associated with battery life. Within the present technology, the only reliable method of determining a battery's capacity to deliver its rated stored energy is to fully charge the battery in accordance with manufacturer's recommendations and then to discharge it at the manufacturer's prescribed rate of 1C. In effect, each such test would consume one of the battery's useful life cycles. In order to maximize that number of realizable life cycles, the user may prefer to reduce the battery capacity test to some multiple of the number of use cycles, or to a periodic check, such as a weekly or monthly check. Logic circuit stage 67 provides this capability. Skip complete stage 68 continues to skip the capacity test cycle until either the prescribed time period or number of skips has been completed. Until that event, the skip complete stage 68 counter-cycles the battery to service charging stage 69 and generally B in FIGS. 5–7.

When the skip cycles are complete from skip complete stage 68, or logic stage 67 has determined that the capacity cycle is to be initiated, an indicator stage 70 is illuminated which indicates the initiation stage 71 of the capacity test. Rate of charge stage 72 determines whether the battery has a normal or rapid charge type. This determination is generally automatic by virtue of the specific electrical connections built into the battery by the manufacturer. A normal or slow charge battery will generally have only 2 connections. A rapid charge battery will have three or more connections. These additional connections are for built-in devices, normally a thermister, for the purpose of determining when the battery has been fully charged. Connections are also installed in some battery types to automatically determine the type of battery being inserted. If the battery is of the normal charge type, it is charged at normal charge stage 73 for a current $I_f$ equal to the level determined by the manufacturer for a minimum time $t_f$ determined by the manufacturer (generally between 7 and 14 hours). This current may be some fraction of the 1C current. For example, 1/3rd to 1/10th of the 1C current. This charge continues until the normal timer stage 74 determines t is greater than or equal to $t_f$. When t is greater than or equal to $t_f$, the battery is sequenced by normal timer stage 74 to sequencing stage 75. If the battery is a rapid charge type, it will be charged by rapid charge stage 76 at a rate Ic specified by the manufacturer in the range of ½ to 2C. The rapid charge continues until the temperature $T^o$ is determined to be greater than or equal to $T_c^o$ at temperature detector stage 77. $T^o$ is a function of the internal temperature of the battery as derived from the thermister of other device provided by the manufacturer. This technique is used in the current fast charging chargers supplied by suppliers of battery packs.

Upon completion of either the normal or rapid charge cycles, the batteries are sequenced by sequencing stage 75 to battery capacity test stage 78, where the battery capacity test is initiated. The battery is discharged at Ix, normally the 1C discharge ratio as specified by the supplier of the battery. The terminal voltage V is monitored at test voltage monitor 79 and the time is monitored at test monitor 80. A battery will pass the capacity test when the terminal voltage V is greater than Vx for a period equal to tx. If the battery passes the test, the pass sequencer 81 illuminates the battery pass indicator. Batteries which pass the capacity test are sequenced by sequencer 81 to service charging stage 69.

If the terminal voltage falls below Vx prior to tx, then stop test stage 82 stops the test. This prevents harmful discharge of the cells and possible reversal of the cells' voltages. Program recycle 83 makes a decision as to recycling. If the battery is not cycled to rejuvenate it by a series of charges and discharges, then the battery is sequenced to fail switch 84, which illuminates the battery fail indicator. Logic detects if the failed battery is present or has been removed at detector 85. When the battery is removed, extinguisher 86 extinguishes the fail indicator and resets the system. If the program recycle 83 is active, then the battery is cycled by cycle stage 87 through a predetermined number of charges and capacity tests, or until the battery is passed by pass sequencer 81. The battery to be rejuvenated is recycled to cycle stage 87 and rejuvenation starter 88 to capacity test initiation stage 71, and therefrom the battery follows the previously described paths either to pass sequencer 81 or to cycle stage 87. If the rejuvenated battery passes the test and reaches pass sequencer 81, it is treated as a normal battery ready for service. Each time it fails the test and is programmed through stages 82, 83, and 87, the counter at cycle stage 87 counts the number of rejuvenation cycles. If the number of rejuvenated cycles for a given battery exceeds a predetermined number, then the battery is sequenced to fail switch 84 by cycle stage 87. The cycle is then stopped and the battery fail indicator is illuminated by fail switch 84.

Batteries which are sequenced by service charging stage 69 are charged for service and maintained by the invention in a serviceable condition. Two important functions are provided by this aspect of the method of the present invention. Firstly, batteries which have been previously tested for capacity and statistically known to pass prescribed limits, are now fully charged and ready for service. Secondly, the method of the invention provides a system for preventing memory effect by cycling the battery at least periodically through a deep discharge and capacity test. The purpose of the deep discharge and capacity test is to prevent the accumulation of memory and to negate any memory effects which may have been accumulated during a period between the time the battery was charged and when the battery would actually be placed in field service.

With reference to FIG. 6, the battery is charged for service by service charge stage 69 through service charge stage 95 in accordance with the manufacturing specifications and utilizing the same procedures as described, supra, in regard to the steps of rate of charge stage 72 through the rapid timer stage 77. In particular, service charging is initiated at service charge stage 69 and the rate of charge stage 90 determines whether the battery is a normal or rapid charge type. If the battery is a normal charge type, it is service charged at normal service charge stage 91. The service charge is continued until the normal service timer 92 determines that $t$ is greater than or equal to $t_f$, and in that event the battery is sequenced to the service sequencing stage 93. If the battery is of the rapid charge type, it is charged by the rapid service charge stage 94 at a rate Ic specified by the manufacturer in the range of $\frac{1}{8}$ to 2C. This rapid service charge continues until the temperature $T^o$ is determined to be greater than or equal to $T_c^o$ at temperature detector stage 95.

The fully charged battery is switched by service sequencing stage 93 to service hold cycle 96. The battery charging indicator is extinguished and the battery ready indicator is illuminated by service hold cycle 96. The battery is now subjected to a trickle charge Iy at a rate equal to the battery manufacturer's specifications, and a timer is initiated at the start of the battery hold cycle.

If the battery is removed during the period when the hold time is less than $t_y$, then presence indicator 97 will detect the removal of the battery. Thereafter, battery reset stage 98 will extinguish the battery indicators and reset the system. If the battery is not used prior to $t_y$, recycle is initiated by service timer stage 99. The recycle initiates the deep discharge cycle and provides the preventive maintenance which will negate the effects of memory accumulation inherent in all chargers which continue to provide charging current for prolonged periods of time and/or negates the memory effect which accumulates through periods of disuse whether or not batteries are stored in activated chargers. Battery service indicator extinguisher 100 extinguishes the battery indicators, and the entire cycle begins again at detector 58.

FIG. 7 sets forth illustrative circuits to charge and discharge rechargeable batteries, which circuits are well known in the prior art. These include circuitry for measurement of cell voltage, for charging, and for sequencing of batteries through rapid charging and trickle charging cycles. These circuits may have varying degrees of automation of their control functions.

With reference to FIG. 7, a battery charger would contain a receiving connector 101 which has terminals compatible with the battery type for which it was manufactured. A battery 102 with four terminals is shown.

The battery charger is powered by a transformer type power supply 103 with a rectifier bridge 103a and voltage regulator 103b which would supply regulated B+ to the battery charger subsystems.

Control system 104 controls all functions including the sequence switch 105. On sequence switch 105, deck 106 switches the A terminal of the battery; 107 switches the B terminal of the battery; 108 switches the C terminal, and deck 109 switches the D terminal. Deck 110 switches the indicator lights.

In the deep discharge cycle, the sequencing switch decks are in the step #1 position. The positive terminal of the battery 102 is connected to a series regulating transistor 111 which controls the rate of discharge. The current is measured across a resistor 112 by a differential amplifier 113. The other input of differential amplifier 113 is connected to a reference source. The current Id specified by the battery manufacturer is adjusted by use of the variable resistance, voltage dividing bridge 115. Thus, bridge 115 and reference 114 serve to provide amplifier 113 with a reference against which the actual discharge current through resistor 112 is measured. The output current of amplifier 113 drives the regulating transistor 111 through resistor 116. The regulated discharge current continues to flow during the deep discharge cycle until a voltage Vn corresponding to the deep discharge voltage is measured across the terminals A and B. This measurement is accomplished by differential amplifier 117. It measures the voltage across the A and B terminals of the battery and the compares it to the voltage produced by reference 118 and resistive voltage divider 119. When the voltage corresponding to the voltage produced at divider 119 is reached, the comparator amplifier 117 drives a switch stage 120, which drives the control system through the x−1 connection. The control system 104 then illuminates the proper indicator and switches the sequence switch to the next cycle which is the charge cycle.

In sequence position #2, the battery is connected to the series current regulating transistor 121. This transistor is connected to the B+ and the A terminal of the battery through switch deck 106. The B terminal battery is connected to B-2 connection of deck 107. Differential amplifier 122 monitors the actual charging current through resistor 123. The other two inputs of the differential amplifier 122 are utilized to select which charging current is applied to the battery during charge. Gate 124 selects the rapid charge rate charge current. Gate 125 selects the normal charge rate current. These gates are also connected to the control system which determines which gate is energized in accordance with the actual type of battery and actual sequence step. Adjustment for the particular battery manufactured type is made by the reference voltage divider bridges 126 and 127 and the reference source 128.

The other input of differential amplifier 122 provides for charge cycle cut-off control through gate 129. Gate 129 has two inputs. A timing circuit 131 cuts the charging cycle off at a given time in the case where a normal rate battery is being charged. If the rapid charge battery is inserted into the receiver, terminal C detects its presence and control system 104 is provided with switching information. The control system 104 turns off the Y5 timer and puts the system under control of differential amplifier 130. Differential amplifier 130 compares the state of charge signal with a reference voltage. When the voltage reaches a prescribed value such as the reference voltage 132, the reference amplifier 130 cuts off gate 129 and stops the charging when the thermister reaches the reference value. The control system then signals the proper indicators and is switched to the capacity test.

The capacity test would utilize a circuit similar to that described supra for discharging the battery and to determine the terminal voltage Vx during the discharge cycle. A timer similar to timing circuit 131 would be utilized to determine if the battery maintained the terminal voltage for a period of time equivalent to 1C. Subsequent to these, the sequencing switch 105 would sequence to the recharge cycle and the hold cycle for successfully passed batteries. If the batteries failed, then the cycle would be switched back to step #2 for rejuvenation as previously described.

Batteries which successfully pass the test and remain unused for a period of time in excess of a given amount, would then be switched to step #1 for the preventive maintenance cycle.

The basic and novel characteristics of the method for automatically maintaining rechargeable batteries of the present invention will be readily understood from the foregoing disclosure by those skilled in the art. It will become readily apparent that various changes and modifications may be made in the form, construction and arrangement of the method for automatically maintaining rechargeable batteries of the present invention as set forth hereinabove without departing from the spirit and scope of the invention. Accordingly, the preferred and alternative embodiments of the present invention set forth hereinabove are not intended to limit such spirit and scope in any way.

What is claimed is:

1. A method for automatically rejuvenating and maintaining rechargeable batteries at maximum capacity, said method comprising the steps of:

detecting the presence of the battery;

initially discharging the battery to a selected value of deep discharge, said selected value being above the level of cell reversal;

initially recharging the battery to its rated capacity;

subsequently discharging the battery at a controlled rate and measuring the battery output voltage, and determining whether the output voltage is above a selected minimum voltage for a selected discharge period;

if the battery fails to meet the selected minimum voltage for the selected discharge period, continuing to recharge and redischarge the battery until the battery meets the selected minimum voltage for the selected discharge period or for a selected number of cycles to rejuvenate the battery by removing any reversible memory effects;

if, after the selected number of recharge and redischarge cycles, the battery voltage continues to fall below the selected minimum voltage for the selected discharge period, discarding the battery as having irreversible memory effects;

if the battery is not discarded, further recharging the battery to its full rated capacity;

maintaining such full rated capacity by trickle charging; and periodically repeating such steps of discharging to deep discharge and recharging to full rated capacity to avoid onset of battery memory caused by prolonged charging.

2. The method of claim 1 wherein said initial discharging removes all but a minute fraction of the stored energy of the rechargeable battery.

3. The method of claim 1 wherein said initial discharging prevents the accumulation of memory effect due to extracting small and/or incomplete withdrawals of energy from the rechargeable battery and/or disuse, crystal growth and/or any other factors.

4. The method of claim 1 wherein the initial discharging provides for a uniform degree of discharge within the actual limits of the cell capacity of the rechargeable battery independent of the degree to which the battery is discharged in actual use.

5. The method of claim 1 wherein the selected minimum rated capacity of the rechargeable battery is determined by a minimum voltage for a given discharge period.

* * * * *